US009577639B1

(12) United States Patent
Sahu et al.

(10) Patent No.: US 9,577,639 B1
(45) Date of Patent: Feb. 21, 2017

(54) SOURCE SEPARATED CELL

(71) Applicant: QUALCOMM Incorporated, San Diego, CA (US)

(72) Inventors: Satyanarayana Sahu, San Diego, CA (US); Xiangdong Chen, San Diego, CA (US); Venugopal Boynapalli, San Marcos, CA (US); Hyeokjin Bruce Lim, San Diego, CA (US); Mukul Gupta, San Diego, CA (US); Hananel Kang, San Diego, CA (US); Chih-lung Kao, San Diego, CA (US); Radhika Guttal, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 14/864,486

(22) Filed: Sep. 24, 2015

(51) Int. Cl.
*H03K 19/0948* (2006.01)
*H01L 27/092* (2006.01)
*H01L 27/02* (2006.01)
*H01L 23/528* (2006.01)

(52) U.S. Cl.
CPC ......... *H03K 19/0948* (2013.01); *H01L 23/528* (2013.01); *H01L 27/0207* (2013.01); *H01L 27/0924* (2013.01)

(58) Field of Classification Search
None
See application file for complete search history.

(56) References Cited

U.S. PATENT DOCUMENTS

| 4,231,055 A * | 10/1980 | Iizuka | H01L 27/0927 257/316 |
| 4,339,710 A * | 7/1982 | Hapke | G06F 11/2236 324/750.3 |
| 4,799,195 A * | 1/1989 | Iwahashi | G11C 16/28 365/185.21 |
| 4,808,850 A * | 2/1989 | Masuda | H03K 19/09448 326/110 |

(Continued)

OTHER PUBLICATIONS

Srinivasan V., et al., "Floating-Gates Transistors for Precision Analog Circuit Design: An Overview," 48th Midwest Symposium on Circuits and Systems, IEEE, 2005, vol. 01, pp. 71-74.

(Continued)

*Primary Examiner* — Crystal L Hammond
(74) *Attorney, Agent, or Firm* — Arent Fox LLP

(57) ABSTRACT

A MOS device includes a first MOS transistor having a first MOS transistor source, a first MOS transistor drain, and a first MOS transistor gate. The MOS device also includes a second MOS transistor having a second MOS transistor source, a second MOS transistor drain, and a second MOS transistor gate. The second MOS transistor source and the first MOS transistor source are coupled to a first voltage source. The MOS device includes a third MOS transistor having a third MOS transistor gate, the third MOS transistor gate between the first MOS transistor source and the third MOS transistor source, the third MOS transistor further having a third MOS transistor source and a third MOS transistor drain, the third MOS transistor source being coupled to the first MOS transistor source, the third MOS transistor drain being coupled to the second MOS transistor source, the third MOS transistor gate floating.

30 Claims, 11 Drawing Sheets

(56) References Cited

U.S. PATENT DOCUMENTS

| | | | | |
|---|---|---|---|---|
| 4,825,417 | A * | 4/1989 | Seo | G11C 7/065 257/E27.085 |
| 4,835,423 | A * | 5/1989 | de Ferron | H03K 17/693 327/436 |
| 4,843,594 | A * | 6/1989 | Tanaka | G11C 16/24 365/185.21 |
| 4,916,334 | A * | 4/1990 | Minagawa | G11C 16/30 257/369 |
| 5,097,444 | A | 3/1992 | Fong | |
| 5,239,207 | A * | 8/1993 | Miyamoto | H03K 17/223 327/530 |
| 5,272,586 | A * | 12/1993 | Yen | H02H 9/046 257/356 |
| 5,600,267 | A * | 2/1997 | Wong | H03K 19/0016 326/50 |
| 5,952,946 | A * | 9/1999 | Kramer | H03M 1/802 341/136 |
| 5,990,816 | A * | 11/1999 | Kramer | H03M 1/74 341/136 |
| 6,127,852 | A * | 10/2000 | Ogawa | G06G 7/122 327/50 |
| 6,351,158 | B1 * | 2/2002 | Shearon | H03K 19/00315 326/22 |
| 6,795,347 | B2 | 9/2004 | Ausserlechner et al. | |
| 6,882,011 | B1 * | 4/2005 | Chen | H01L 27/027 257/314 |
| 6,950,342 | B2 | 9/2005 | Lindhorst et al. | |
| 7,362,128 | B2 * | 4/2008 | Choi | H03K 19/0005 326/30 |
| 7,495,469 | B2 * | 2/2009 | Park | H03K 19/0005 326/27 |
| 8,054,687 | B2 | 11/2011 | Hasler et al. | |
| 2002/0012265 | A1 * | 1/2002 | Tsuda | G11C 11/412 365/154 |
| 2005/0052926 | A1 * | 3/2005 | Agata | G11C 16/0425 365/222 |
| 2007/0139081 | A1 * | 6/2007 | Lee | G11C 7/22 326/93 |
| 2008/0055965 | A1 * | 3/2008 | Eftimie | G11C 16/0441 365/149 |
| 2008/0251848 | A1 | 10/2008 | Borot et al. | |
| 2008/0297254 | A1 * | 12/2008 | Chang | H03F 3/3022 330/264 |
| 2011/0193544 | A1 * | 8/2011 | Iacob | G05F 3/242 323/315 |
| 2013/0207736 | A1 * | 8/2013 | Lee | G01R 27/02 333/17.3 |
| 2014/0103967 | A1 * | 4/2014 | Yang | H03K 19/01852 327/108 |
| 2015/0221639 | A1 | 8/2015 | Chen et al. | |
| 2015/0255461 | A1 * | 9/2015 | Chintarlapalli Reddy | H01L 27/0924 257/369 |

OTHER PUBLICATIONS

International Search Report and Written Opinion-PCT/US2016/050571-ISA/EPO-Dec. 8, 2012 (152740WO ).

* cited by examiner

US 9,577,639 B1

SOURCE SEPARATED CELL

BACKGROUND

Field

The present disclosure relates generally to layout construction, and more particularly, to a source separated cell that may be part of a standard cell library.

Background

A standard cell is an integrated circuit that may be implemented with digital logic. An application-specific integrated circuit (ASIC), such as a system-on-a-chip (SoC) device, may contain thousands to millions of standard cells. Reducing a size/area footprint of ASICs is beneficial. Reducing a size of the process technology may allow for the size/area footprint of ASICs to be reduced. In some instances, when reducing the size/area footprint of ASICs, resistance of one or more current paths through one or more of the standard cells may be increased. There is currently a need to address such an increased resistance in one or more current paths within a metal oxide semiconductor (MOS) device in a standard cell.

SUMMARY

In an aspect of the disclosure, a MOS device includes a first MOS transistor having a first MOS transistor source, a first MOS transistor drain, and a first MOS transistor gate. The MOS device also includes a second MOS transistor having a second MOS transistor source, a second MOS transistor drain, and a second MOS transistor gate. The second MOS transistor source and the first MOS transistor source are coupled to a first voltage source. The MOS device includes a third MOS transistor having a third MOS transistor gate, the third MOS transistor gate between the first MOS transistor source and the third MOS transistor source, the third MOS transistor further having a third MOS transistor source and a third MOS transistor drain, the third MOS transistor source being coupled to the first MOS transistor source, the third MOS transistor drain being coupled to the second MOS transistor source, the third MOS transistor gate floating.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

As discussed supra, a standard cell is an integrated circuit that may be implemented with digital logic. An ASIC, such as an SoC device, may contain thousands to millions of standard cells. Reducing a size/area footprint of ASICs is beneficial. Reducing a size of the process technology may allow for the size/area footprint of ASICs to be reduced. In some instances, as discussed infra in relation to FIG. 1 and FIG. 2, when reducing the size/area footprint of ASICs, resistance of one or more current paths through one or more of the standard cells may be increased.

Figure 1:
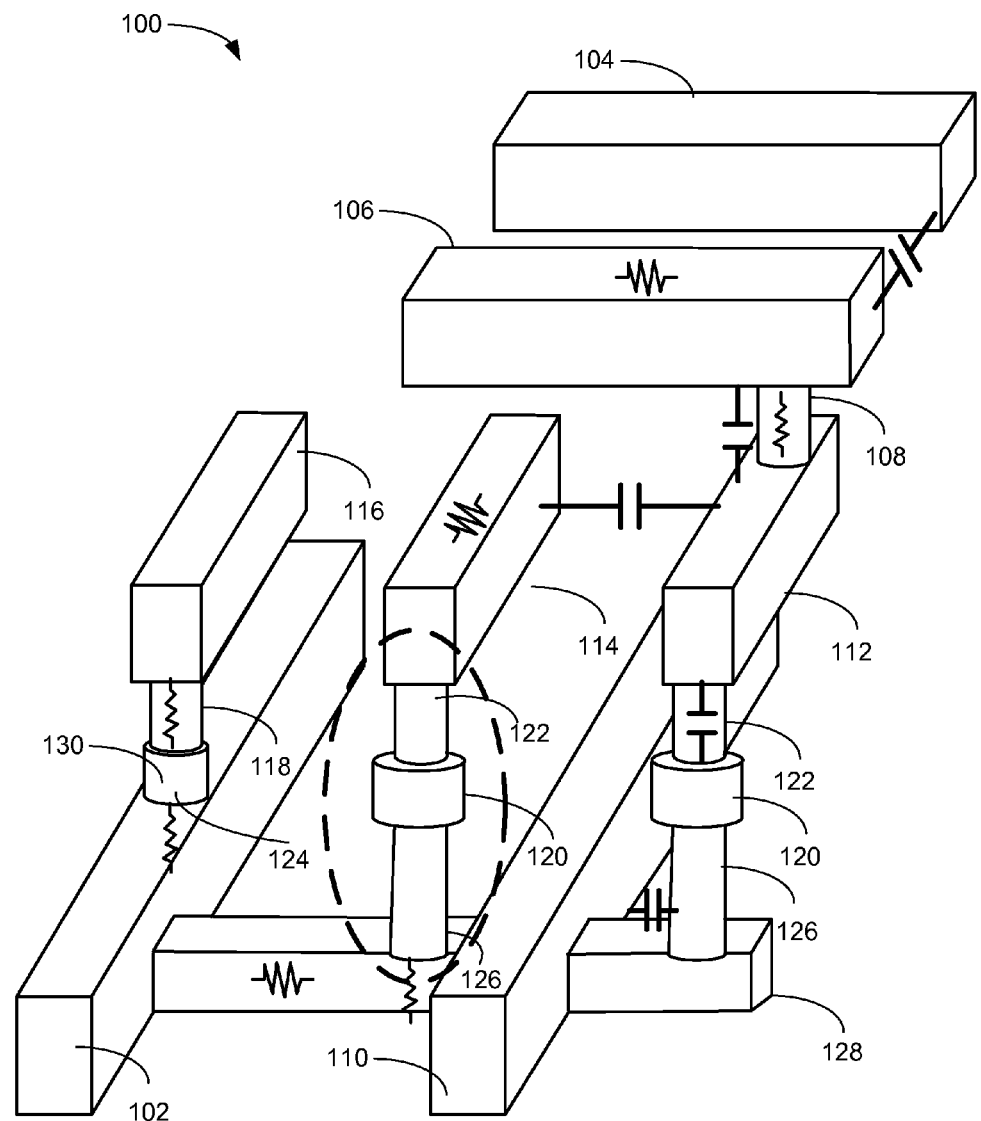
FIG. 1 is a diagram illustrating possible components in a 14 nm manufacturing process technology.

FIG. 1 is a diagram 100 illustrating possible components in a 14 nm manufacturing process technology. The diagram 100 illustrates metal two (M2) layer interconnects 104, 106, a via (V1) 108, and metal one (M1) layer interconnects 112, 114, 116. The via 108 is illustrated connecting the M2 layer interconnect 106 to the M1 layer interconnect 112. The diagram 100 further illustrates vias (V0) 118, 122. The vias 122 couple the M1 layer interconnects 112, 114 to metal diffusion (MD) interconnects 120, 126. The MD interconnect 126 may be referred to as a TS interconnect/contact. The MD interconnects 120, 126 are coupled to fin 128, which may be a MOS source or drain. The fin 128 extends through the gate interconnects 102, 110. The gate interconnects 102, 110 may be referred to as POLY gate interconnects. The vias 118 couple the M1 layer interconnect 116 to the metal POLY (MP) interconnect 130. The MP interconnect 130 contacts the gate interconnect 102. The MP interconnect 130 may be referred to as a CB interconnect/contact. Diagram 100 illustrates various resistances and parasitic capacitances within and between components (e.g., interconnects, fins, vias) in the diagram 100.

Figure 2:
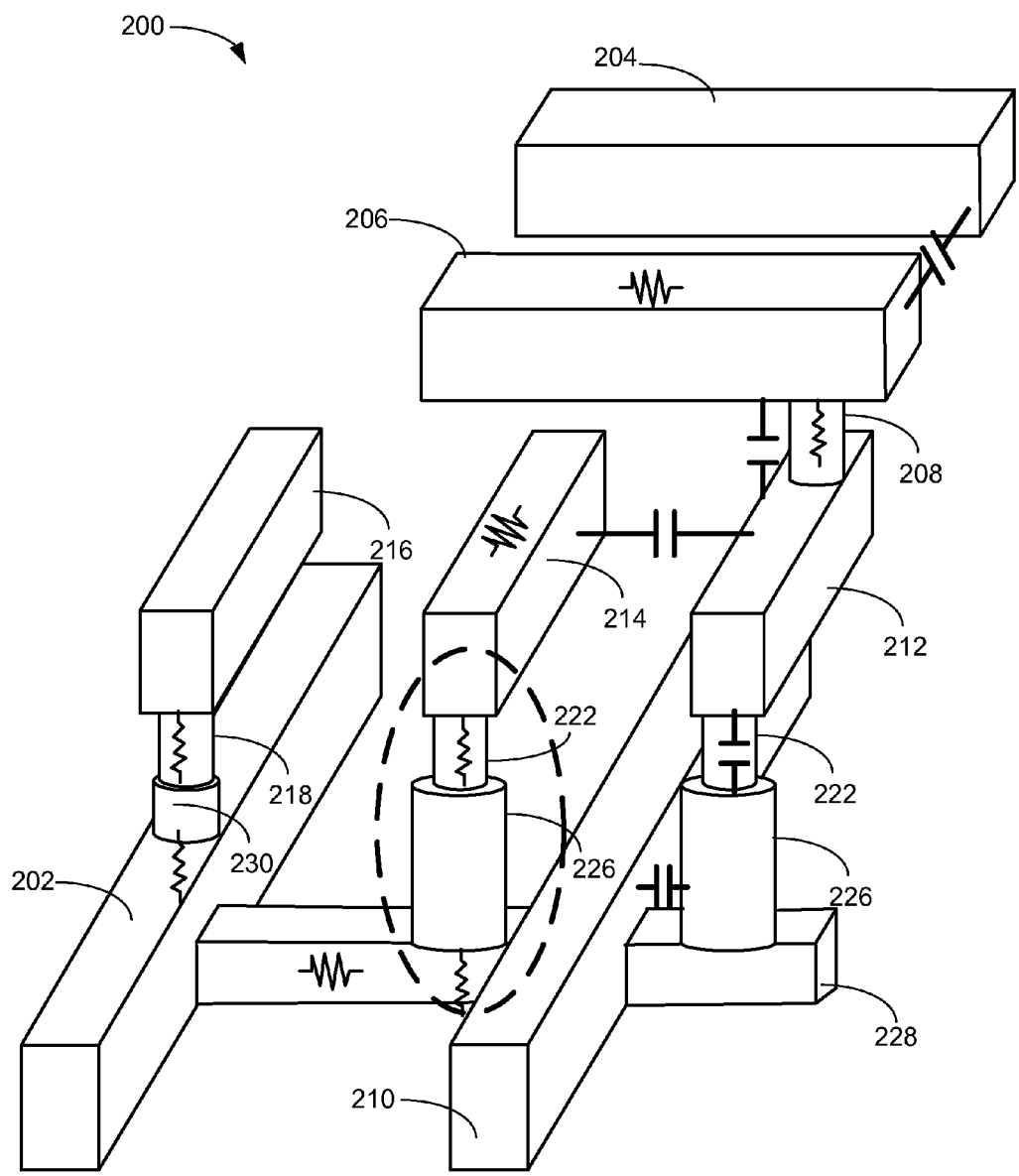
FIG. 2 is a diagram illustrating possible components in a 10 nm manufacturing process technology.

FIG. 2 is a diagram 200 illustrating possible components in a 10 nm manufacturing process technology. The diagram 200 illustrates M2 layer interconnects 204, 206, a via (V1) 208, and M1 layer interconnects 212, 214, 216. The via 208 is illustrated connecting the M2 layer interconnect 206 to the M1 layer interconnect 212. The diagram 200 further illustrates vias (V0) 218, 222. The vias 222 couple the M1 layer interconnects 212, 214 to MD interconnects 226. The MD interconnects 226 may be referred to as CA interconnects/contacts. The MD interconnects 226 contact fin 228, which may be a MOS source or drain. The fin 228 extends through the gate interconnects 202, 210. The gate interconnects 202, 210 may be referred to as POLY gate interconnects. The vias 218 couple the M1 layer interconnect 216 to the MP interconnect 230. The MP interconnect 230 contacts the gate interconnect 202. Diagram 200 illustrates various resistances and parasitic capacitances within and between components (e.g., interconnects, fins, vias) in the diagram 200.

Referring to both FIG. 1 and FIG. 2, the resistance of the vias 222 and the MD interconnect 226 in series may be greater than the resistance of the via 122 and the MD interconnects 120, 126 in series. As such, the reduction from the 14 nm manufacturing process technology to the 10 nm manufacturing process technology without additional changes, may result in an increase in resistance in one or more current paths, such as for example, through source or drain connections at the fin 228.

Figure 3:
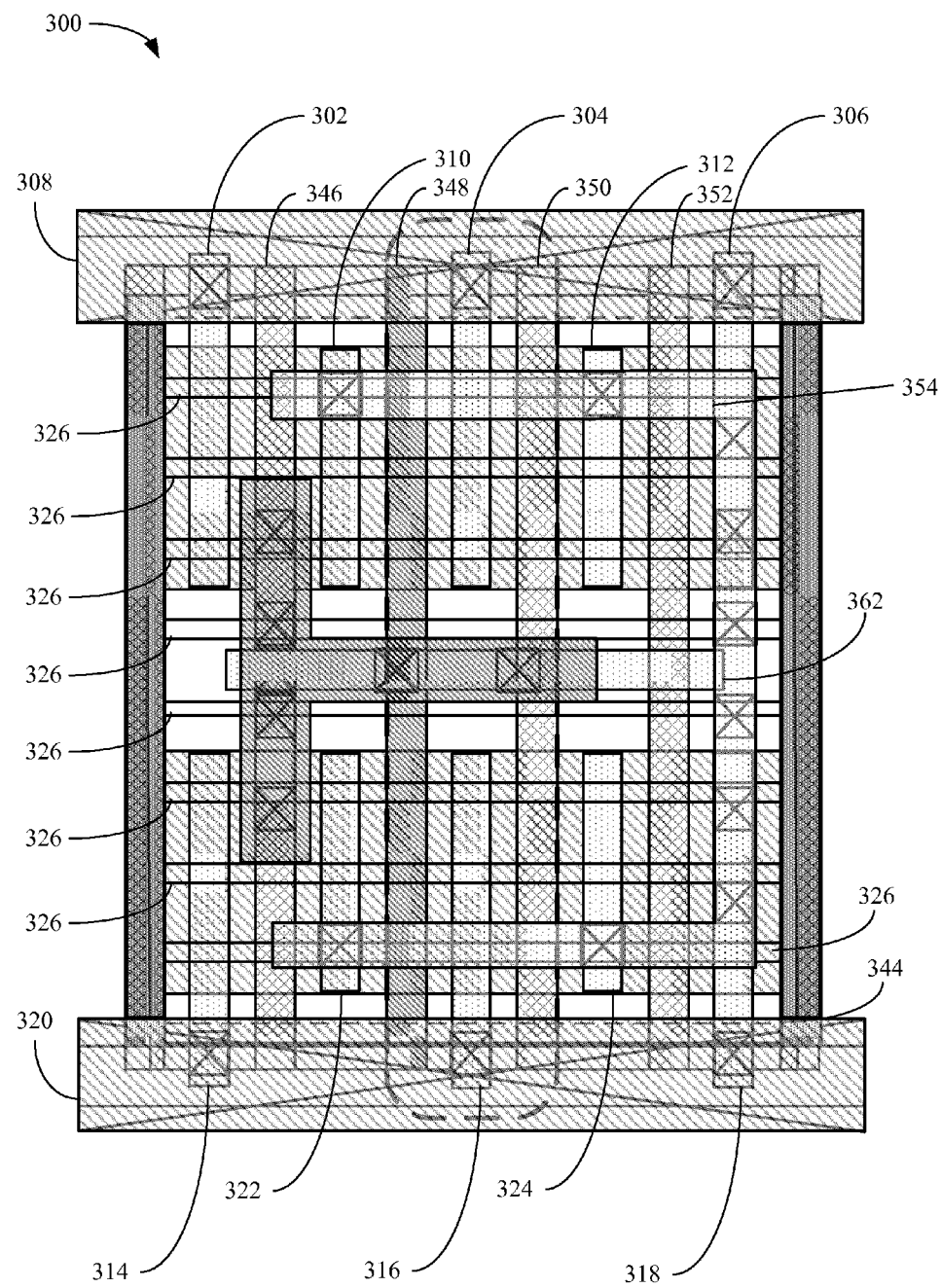
FIG. 3 is a first diagram illustrating an example layout construction.

FIG. 3 is a first diagram 300 illustrating an example layout construction.

Diagram 300 includes a layout for a standard cell including four inverters coupled in parallel. The inverters are constructed from n-type MOS (nMOS) transistors and p-type (pMOS) transistors. Each of the transistors includes a source, a drain, and a gate. In some cases, a drain may be shared between two transistors. In some cases, a source may be shared between two transistors.

In the illustrated example of FIG. 3, the pMOS transistors are at the top of the page, while the nMOS transistors are at the bottom of the page (with "FIG. 3 indicating the bottom of the page). Referring now to the diagram 300, various components of the transistors will be discussed. Referring to the pMOS circuitry, diagram 300 illustrates multiple transistor sources 302, 304, 306. As illustrated in the example of FIG. 3, the transistor sources 302, 304, 306 are each connected to power rail 308 which may be a positive voltage. The voltage on the transistor sources 302, 304, 306 may be referred to as Vdd. The pMOS circuitry in diagram 300 also includes transistor drains 310, 312.

Referring now to the nMOS circuitry, diagram 300 illustrates multiple transistor sources 314, 316, 318. As illustrated in the example of FIG. 3, the transistor sources 314, 316, 318 are each connected to power rail 320 which may be a negative voltage or a ground voltage. The voltage on the transistor sources 314, 316, 318 may be referred to as Vss. The nMOS circuitry in diagram 300 also includes transistor drains 322, 324. Additionally, a series of fins 326 are illustrated in the diagram 300.

FIG. 3 also includes a series of gate interconnects 346, 348, 350, 352 that are shared between both the nMOS circuitry and the pMOS circuitry. The fins 326 extend through the shared gate interconnects 346, 348, 350, 352.

In the pMOS circuitry, a first pMOS transistor is formed by the source 302, the drain 310, and the gate 346. A second pMOS transistor is formed by the source 304, the drain 310, and the gate 348. A third pMOS transistor is formed by the source 304, the drain 312, and the gate 350. A fourth pMOS transistor is formed by the source 306, the drain 312, and the gate 352. As illustrated in FIG. 3, the second pMOS transistor and the third pMOS transistor share the same source 304.

In the nMOS circuitry, a first nMOS transistor is formed by the source 314, the drain 322, and the gate 346. A second nMOS transistor is formed by the source 316, the drain 322, and the gate 348. A third nMOS transistor is formed by the source 316, the drain 324, and the gate 350. A fourth nMOS transistor is formed by the source 318, the drain 324, and the gate 352. As illustrated in FIG. 3, the second nMOS transistor and the third nMOS transistor share the same source 316.

In the illustrated example of FIG. 3, the drains 310, 312, 322, 324 are connected together by the interconnect 354. The gate interconnects 346, 348, 350, 352 are connected together by interconnect 362.

Figure 4:
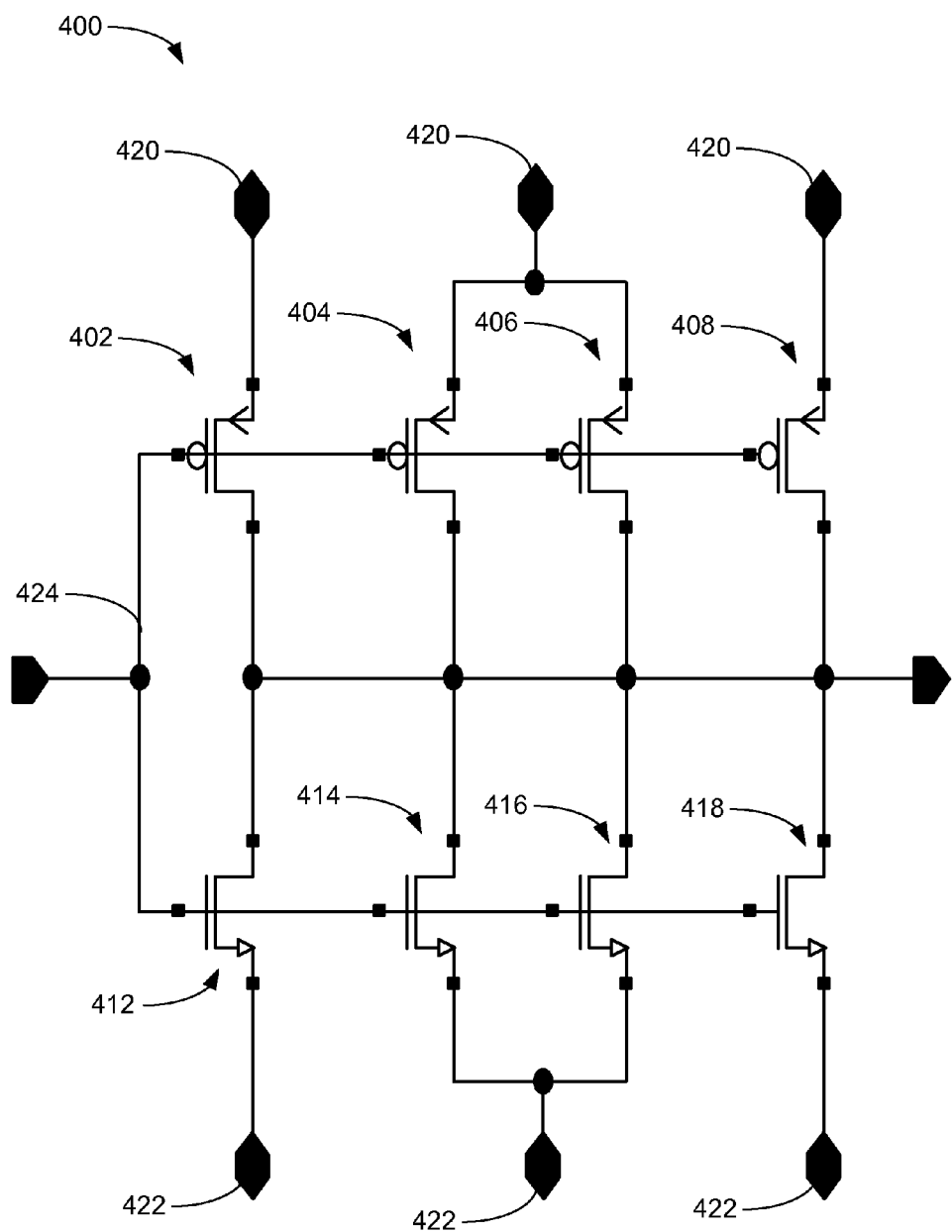
FIG. 4 is a circuit diagram corresponding to the layout of FIG. 3.

FIG. 4 is a circuit diagram 400 corresponding to the layout of FIG. 3. The circuit diagram 400 illustrates schematically the circuitry of the example layout for the standard cell including four inverters that are illustrated in diagram 300 of FIG. 3.

The first pMOS transistor of FIG. 3 (source 302, drain 310, gate 346) is represented by pMOS transistor 402. The second pMOS transistor of FIG. 3 (source 304, drain 310, gate 348) is represented by pMOS transistor 404. The third pMOS transistor of FIG. 3 (source 304, drain 312, gate 350) is represented by pMOS transistor 406. The fourth pMOS transistor of FIG. 3 (source 306, drain 312, gate 352) is represented by pMOS transistor 408. Sources of the pMOS transistors 402, 404, 406, 408 are connected to Vdd 420.

The first nMOS transistor of FIG. 3 (source 314, drain 322, gate 346) is represented by nMOS transistor 412. The second nMOS transistor of FIG. 3 (source 316, drain 322, gate 348) is represented by nMOS transistor 414. The third nMOS transistor of FIG. 3 (source 316, drain 324, gate 350) is represented by nMOS transistor 416. The fourth nMOS transistor of FIG. 3 (source 318, drain 324, gate 352) is represented by nMOS transistor 418. Sources of the nMOS transistors 412, 414, 416, 418 are connected to Vss 422.

As illustrated in FIG. 4, the drains of the first pMOS transistor 402, the second pMOS transistor 404, the third pMOS transistor 406, the fourth pMOS transistor 408, the first nMOS transistor 412, the second nMOS transistor 414, the third nMOS transistor 416, and the fourth nMOS transistor 418 are connected together. Further, the pMOS transistors 404, 406 are illustrated as sharing the same source connection, and the nMOS transistors 414, 416 are illustrated as sharing the same source connection.

Referring to FIG. 3 and FIG. 4, and with reference to FIG. 2, the voltage Vdd is supplied to the source 304, which is shared by the pMOS transistors 404, 406, and the voltage Vss is supplied to the source 316, which is shared by the nMOS transistors 414, 416. With the increased resistance of the source connections 226 between the fin 228 and the M1 layer interconnects 212, less power current can be supplied to each of the pMOS transistors 404, 406 and the nMOS transistors 414, 416 due to current-resistance drop (IR-drop).

As discussed supra, reducing a size/area footprint of ASICs is beneficial. Reducing a size of the process technology may allow for the size/area footprint of ASICs to be reduced. In some instances, as discussed infra in relation to FIG. 1 and FIG. 2, when reducing the size/area footprint of ASICs, resistance of one or more current paths through one or more of the standard cells may be increased. For example, when reducing a size of the process technology from 14 nm to 10 nm, and thereby reducing the size/area footprint of ASICs, resistance of one or more current paths through one or more of the standard cells may be increased.

Figure 5:
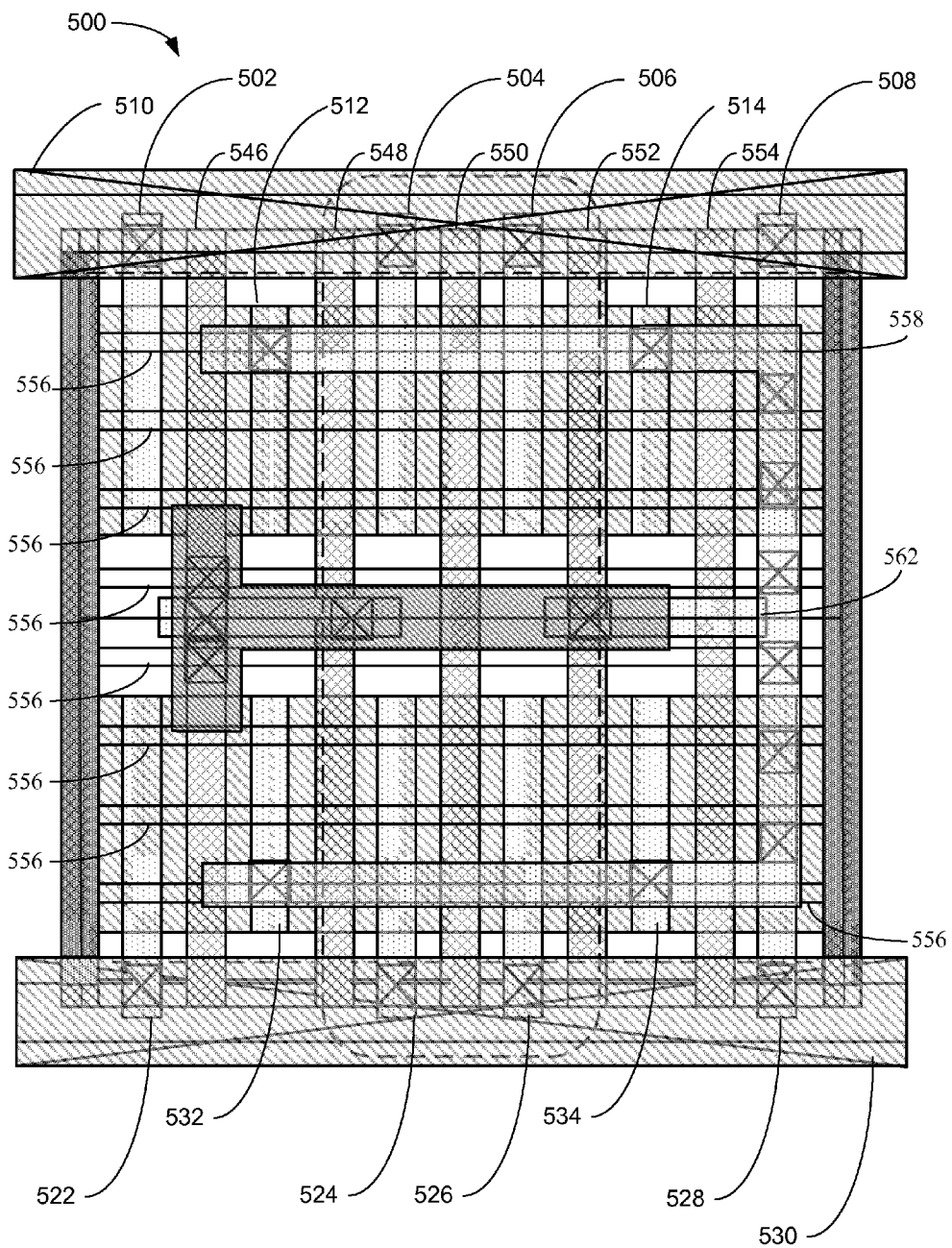
FIG. 5 is a diagram illustrating a first exemplary layout construction with separated sources.
Figure 7:
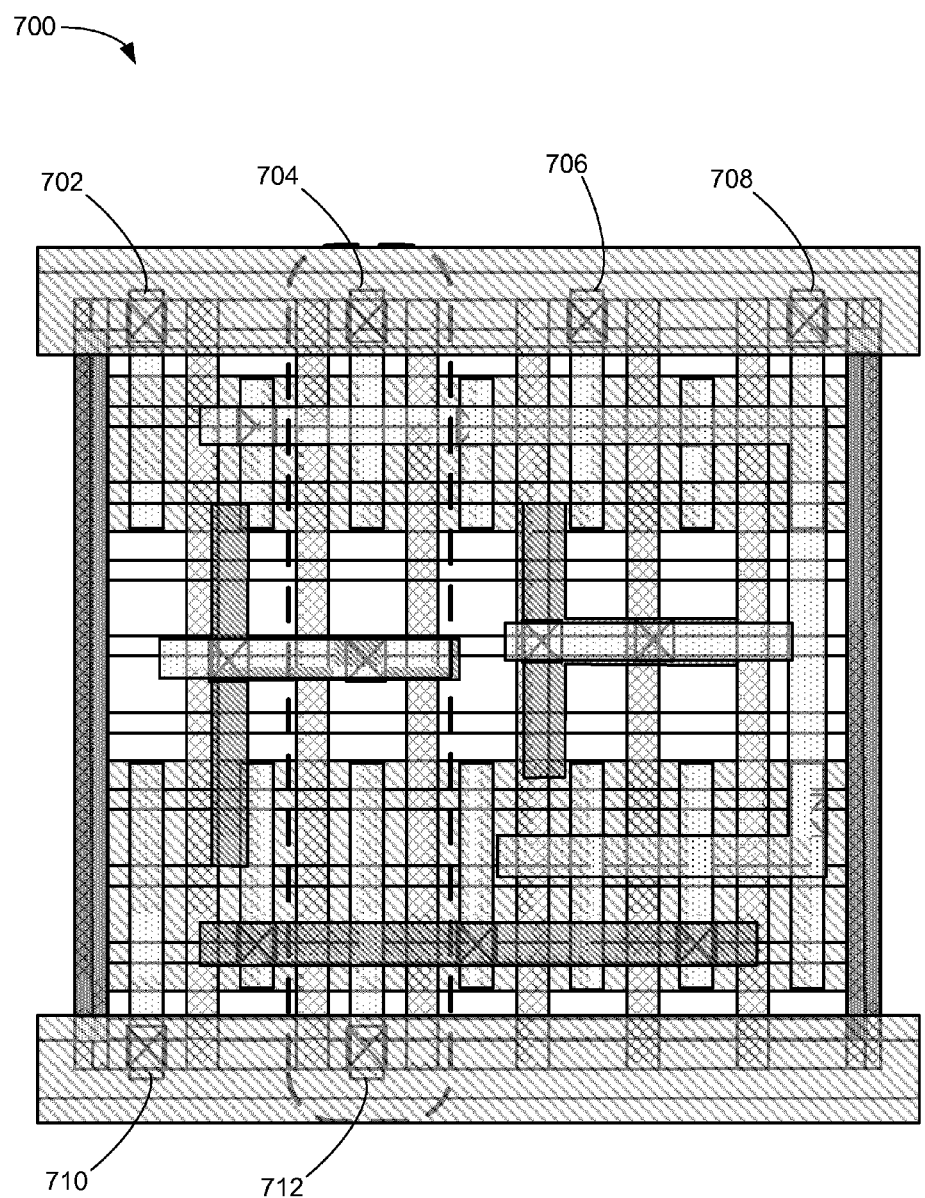
FIG. 7 is second diagram illustrating an example layout construction.
Figure 8:
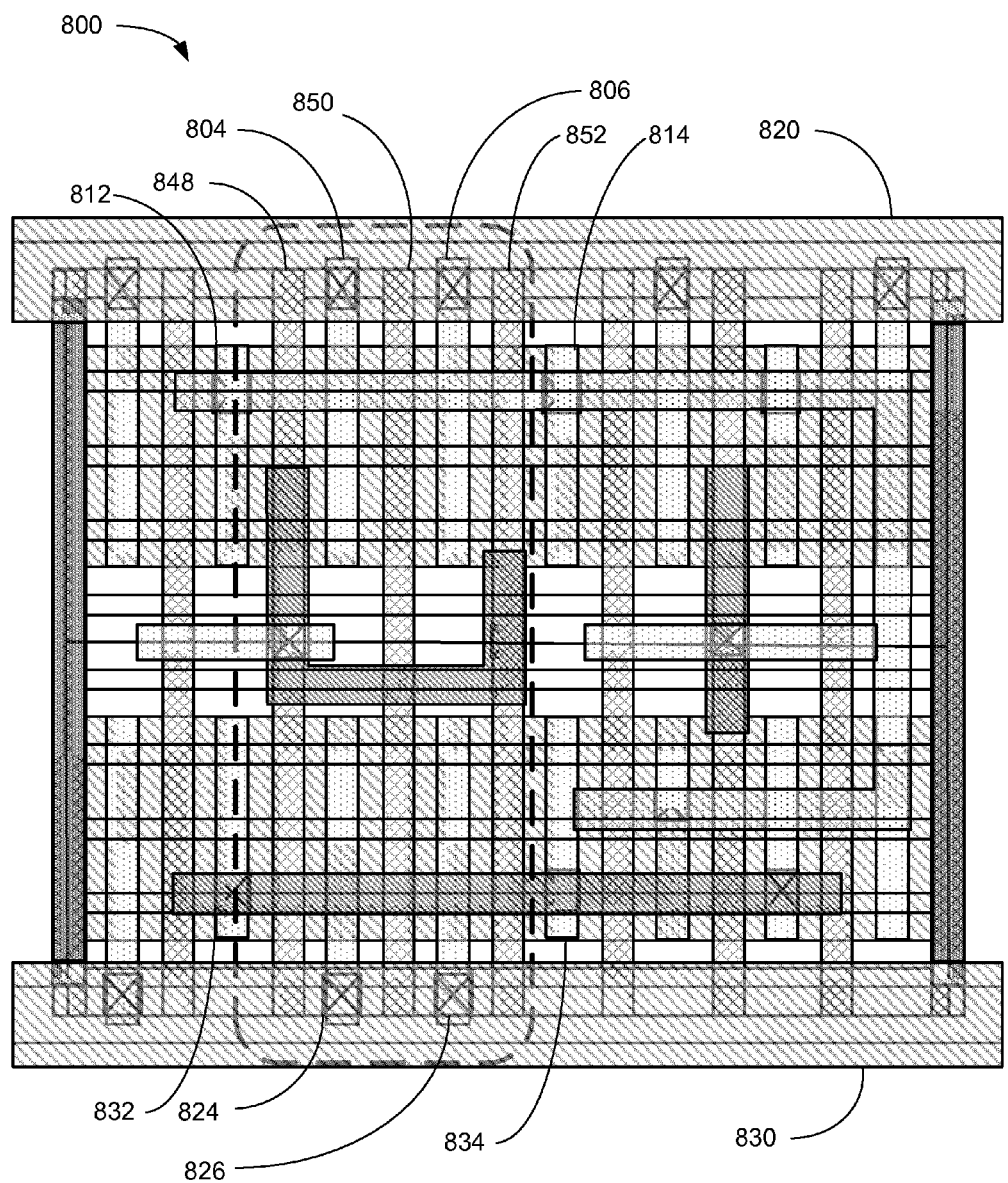
FIG. 8 is a diagram illustrating a second exemplary layout construction.
Figure 9:
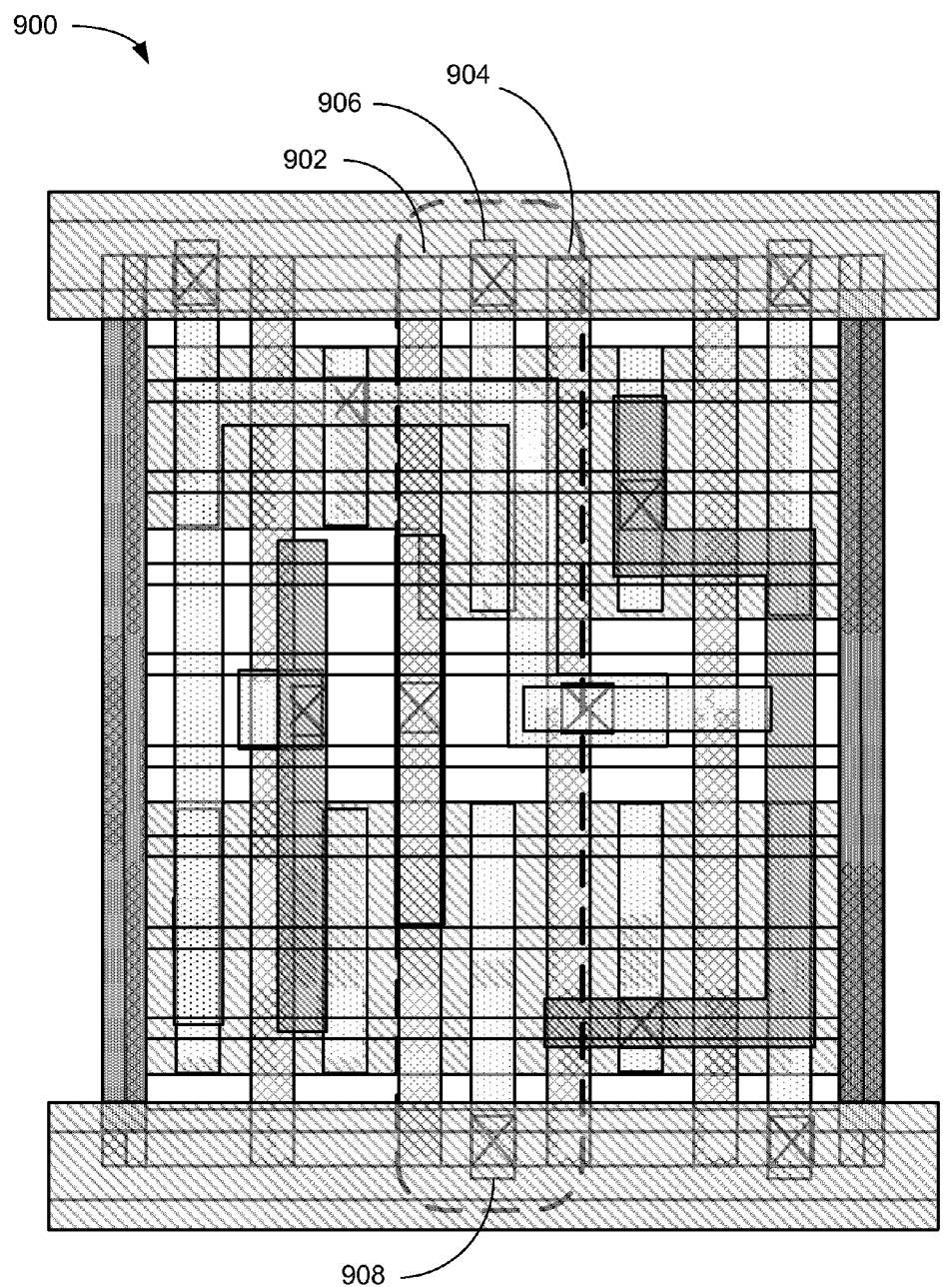
FIG. 9 is third diagram illustrating an example layout construction.
Figure 10:
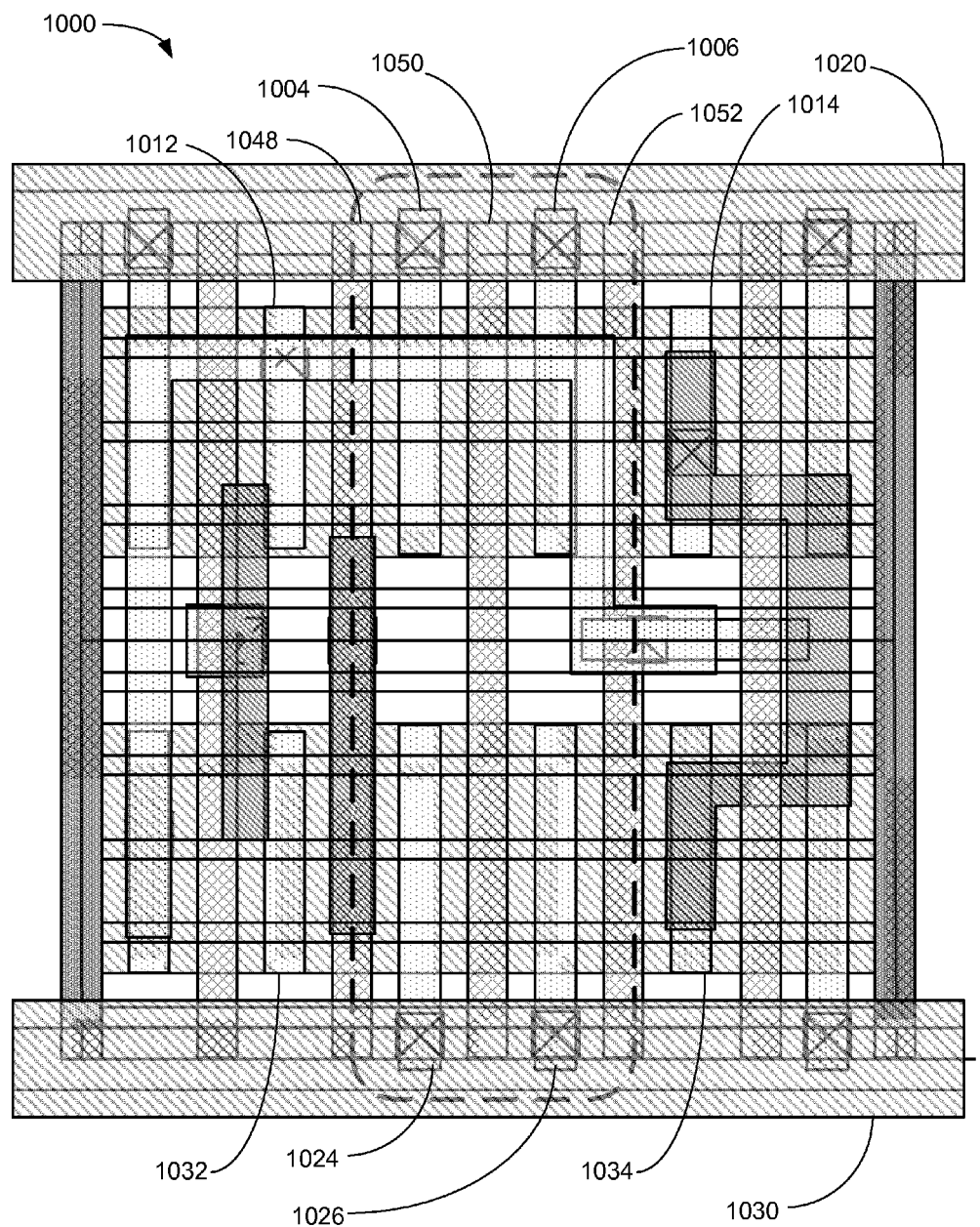
FIG. 10 is a diagram illustrating a third exemplary layout construction.

In some examples, an ASIC design may include both the example layout of FIG. 3, or other circuitry incorporating a structure including a shared source connection, e.g., FIG. 7 or FIG. 9 and the example layout of FIG. 5 or other circuitry incorporating a structure including a source separated connection, e.g., FIG. 8 or FIG. 10. Resistance may impact timing in some circuitry. As resistance increases, the time required for voltage changes in a circuit may increase, e.g., due to one or more increased RC time constants in the circuitry. Accordingly, in some examples, in circuitry where timing is more critical, circuitry such as the example of FIG.

5, 8, or 10 may be used because the resistance, and accordingly, the RC time constant, may be lower. Conversely, in some examples, in circuitry where timing is less critical, circuitry such as the example of FIG. 3, 7, or 9 may be used because the higher RC time constant may not adversely impact the function of that particular circuitry in the ASIC. The circuitry such as the example of FIG. 3, 7, or 9 may take up less area on the ASIC when compared to the circuitry of circuitry such as the example of FIG. 5, 8, or 10.

FIG. 5 is a diagram 500 illustrating a first exemplary layout construction with separated sources 504, 506. Diagram 500 includes a layout for a standard cell including four inverters coupled in parallel. The inverters are constructed from nMOS and pMOS transistors. Each of the transistors includes a source, a drain, and a gate. In some cases, a drain may be shared between two transistors.

In the illustrated example of FIG. 5, the pMOS transistors are at the top of the page, while the nMOS transistors are at the bottom of the page (with "FIG. 5 indicating the bottom of the page). Referring now to the diagram 500, various components of the transistors will be discussed. Referring to the pMOS circuitry, diagram 500 illustrates multiple transistor sources 502, 504, 506, 508. As illustrated in the example of FIG. 5, the transistor sources 502, 504, 506, 508 are each connected to power rail 510 which may be a positive voltage. The voltage on the transistor sources 502, 504, 506, 508 may be referred to as Vdd. The pMOS circuitry in diagram 500 also includes transistor drains 512, 514.

Referring now to the nMOS circuitry, diagram 500 illustrates multiple transistor sources 522, 524, 526, 528. As illustrated in the example of FIG. 5, the transistor sources 522, 524, 526, 528 are each connected to power rail 530 which may be a negative voltage or a ground voltage. The voltage on the transistor sources 522, 524, 526, 528 may be referred to as Vss. The nMOS circuitry in diagram 500 also includes transistor drains 532, 534. Additionally, a series of fins 556 are illustrated in the diagram 500.

FIG. 5 also includes a series of gate interconnects 546, 548, 550, 552, 554 that are shared between both the nMOS circuitry and the pMOS circuitry. The fins 556 extend through the shared gate interconnects 546, 548, 550, 552, 554.

In the pMOS circuitry, a first pMOS transistor is formed by the source 502, the drain 512, and the gate 546. A second pMOS transistor is formed by the source 504, the drain 512, and the gate 548. A third pMOS transistor is formed by the source 504, the drain 506, and the gate 550. Alternatively, the source 504 may be considered a drain and the drain 506 may be considered a source for the third pMOS transistor. A fourth pMOS transistor is formed by the source 506, the drain 514, and the gate 552. A fifth pMOS transistor is formed by the source 508, the drain 514, and the gate 554.

In the nMOS circuitry, a first nMOS transistor is formed by the source 522, the drain 532, and the gate 546. A second nMOS transistor is formed by the source 524, the drain 532, and the gate 548. A third nMOS transistor is formed by the source 524, the drain 526, and the gate 550. Alternatively, the source 524 may be considered a drain and the drain 526 may be considered a source for the third nMOS transistor. A fourth nMOS transistor is formed by the source 526, the drain 534, and the gate 552. A fifth nMOS transistor is formed by the source 528, the drain 534, and the gate 554.

In the illustrated example of FIG. 5, the drains 512, 514, 532, 534 are connected together by the interconnect 558. The gate interconnects 546, 548, 552, 554 are connected together by interconnect 562.

Figure 6:
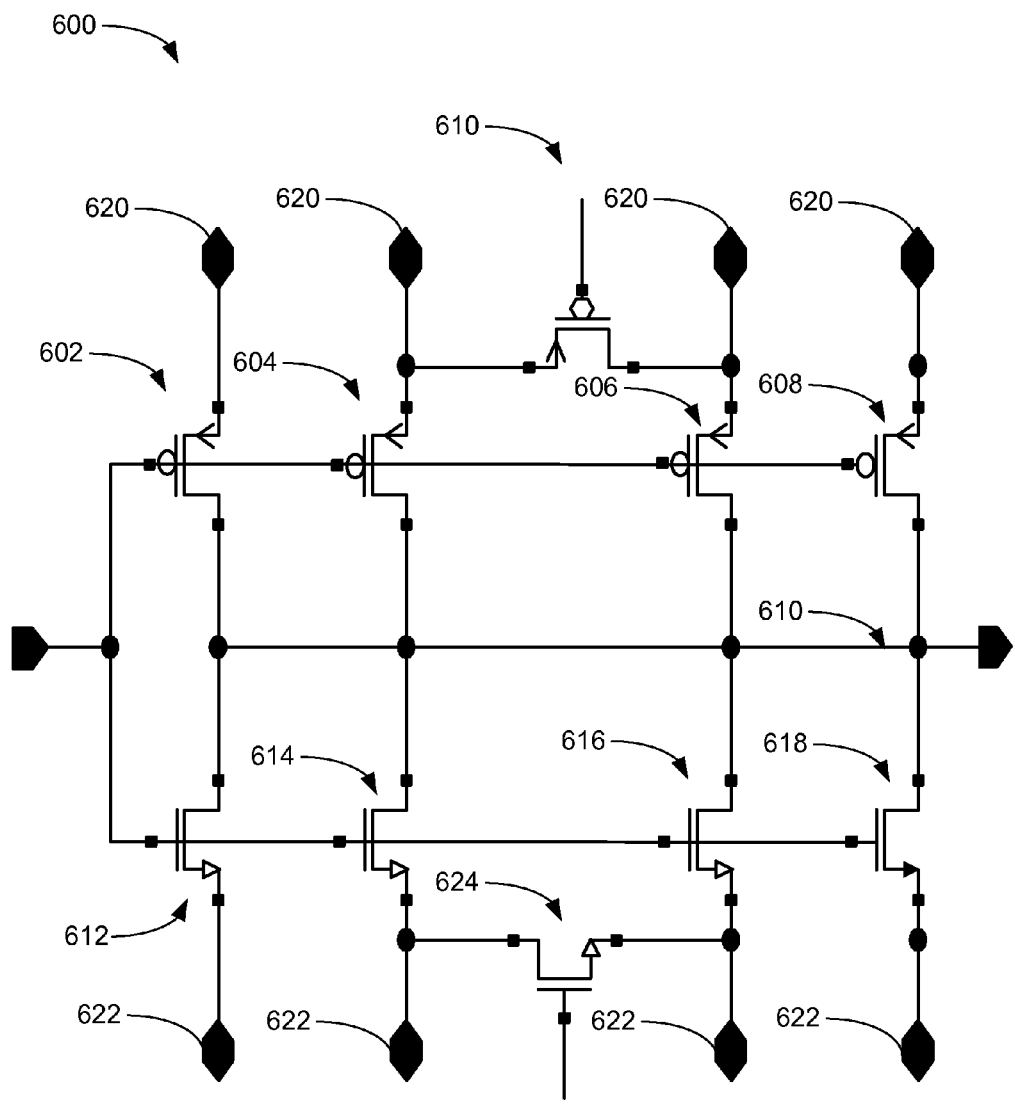
FIG. 6 is an exemplary circuit diagram corresponding to the layout of FIG. 5.

FIG. 6 is an exemplary circuit diagram 600 corresponding to the layout of FIG. 5. The circuit diagram 600 illustrates schematically the circuitry of the example layout for the standard cell including four inverters that are illustrated in diagram 500 of FIG. 5.

The first pMOS transistor of FIG. 5 (source 502, drain 512, gate 546) is represented by pMOS transistor 602. The second pMOS transistor of FIG. 5 (source 504, drain 512, gate 548) is represented by pMOS transistor 604. The third pMOS transistor of FIG. 5 (source 504, drain 506, gate 550; or source 506, drain 504, gate 550) is represented by pMOS transistor 610. The fourth pMOS transistor of FIG. 5 (source 506, drain 514, gate 552) is represented by pMOS transistor 606. The fifth pMOS transistor of FIG. 5 (source 508, drain 514, gate 554) is represented by pMOS transistor 608. Sources of the pMOS transistors 602, 604, 606, 608, 610 are connected to Vdd 620.

The first nMOS transistor of FIG. 5 (source 522, drain 532, gate 546) is represented by nMOS transistor 612. The second nMOS transistor of FIG. 5 (source 524, drain 532, gate 548) is represented by nMOS transistor 614. The third nMOS transistor of FIG. 5 (source 524, drain 526, gate 550; or source 526, drain 524, gate 550) is represented by nMOS transistor 624. The fourth nMOS transistor of FIG. 5 (source 526, drain 534, gate 552) is represented by nMOS transistor 616. The fifth nMOS transistor of FIG. 5 (source 528, drain 534, gate 554) is represented by nMOS transistor 618. Sources of the nMOS transistors 612, 614, 616, 618, 624 are connected to Vss 622.

As illustrated in FIG. 6, the drains of the first pMOS transistor 602, the second pMOS transistor 604, the fourth pMOS transistor 606, the fifth pMOS transistor 608, the first nMOS transistor 612, the second nMOS transistor 614, the fourth nMOS transistor 616, and the fifth nMOS transistor 618 are connected together. Further, unlike the pMOS transistors 404, 406 of FIG. 4, the pMOS transistors 604, 606 do not share the same source connection, and unlike the nMOS transistors 414, 416 of FIG. 4, the nMOS transistors 614, 616 do not share the same source connection.

Referring to FIG. 5 and FIG. 6, and with reference to FIG. 2, the voltage Vdd is supplied to source 504 of the pMOS transistor 604 and source 506 of the pMOS transistor 606, and the voltage Vss is supplied to the source 524 of the nMOS transistor 614 and source 526 of the nMOS transistors 616. Accordingly, the effective resistance of the source connections for the source shared transistors 404, 406, 414, 416 discussed with respect to FIGS. 2-4 may be decreased using the configuration illustrated in FIG. 5 and FIG. 6. In the example of FIG. 3 and FIG. 4 a single connection 226 through via 222, having a resistance, e.g., R, is used for two pMOS transistors 604, 606, and is also used for two nMOS transistors 614, 616. The example illustrated with respect to FIG. 5 and FIG. 6 may address the higher resistance due to the single current connection 226 through via 222 by having multiple current paths, e.g., two. In the example of FIG. 5 and FIG. 6 each transistor has a separate current path. By using two current paths, one current path per transistor, to supply the two pMOS transistors 604, 606, and the two nMOS transistors 614, 616, the effective resistance may be reduced. Using the separate current paths, the effective resistance may be cut in half, e.g., R/2 because the two current paths/connections 226 through via 222 are in parallel. Accordingly, the two transistors together will have a lower IR-drop.

Referring to FIG. 3 and FIG. 5, the source 304 connection is split into two source connections 504, 506. Similarly, the source 316 connection is split into two source connections 524, 526. By splitting the source 304 connection into two source connections 504, 506 or the source 316 connection into two source connections 524, 526, the resistance of the connection to source may be decreased. For example, if the resistance of a single connection to two sources (e.g., source 304 or source 316) is some resistance, R, then the resistance of two separate connections to two sources, each with resistance R, (e.g., source 504, 506 or source connections 524, 526) may generally be approximately R/2 because the two connections are effectively two resistances, R, in parallel. An additional transistor (pMOS) is located between the two sources 504, 506. An additional transistor (nMOS) is located between the two sources 524, 526. The additional pMOS transistor is formed by source 504, drain 506, and gate 550; or source 506, drain 504, and gate 550. The additional nMOS transistor is formed by source 524, drain 526, and gate 550; or source 516, drain 514, and gate 550. Additionally, gate interconnect 550 is floating.

FIG. 7 is second diagram 700 illustrating an example layout construction. The example layout construction of FIG. 7 illustrates an ND2X3 regular standard cell. The MOS device illustrated in diagram 700 includes sources 702, 704, 706, 708, 710, 712. The source 704 is a source for two pMOS transistors. Similarly, the source 712 is a source for two nMOS transistors. FIG. 7 illustrates one example of a series of transistors forming an ND2X3 regular standard cell.

FIG. 8 is a diagram 800 illustrating a second exemplary layout construction. The example layout construction of FIG. 8 illustrates a source separated ND2X3 standard cell. The ND2X3 is constructed from nMOS and pMOS transistors. Each of the transistors includes a source, a drain, and a gate.

In the illustrated example of FIG. 8, the pMOS transistors are at the top of the page, while the nMOS transistors are at the bottom of the page (with "FIG. 8 indicating the bottom of the page). Referring now to the diagram 800, various components of the transistors will be discussed. Referring to the pMOS circuitry, diagram 800 illustrates multiple transistor sources 804, 806. As illustrated in the example of FIG. 8, the transistor sources 804, 806 are each connected to power rail 820 which may be a positive voltage. The voltage on the transistor sources 804, 806, may be referred to as Vdd. The pMOS circuitry in diagram 800 also includes transistor drains 812, 814.

Referring now to the nMOS circuitry, diagram 800 illustrates multiple transistor sources 824, 826. As illustrated in the example of FIG. 8, the transistor sources 824, 826 are each connected to power rail 830 which may be a negative voltage or a ground voltage. The voltage on the transistor sources 824, 826 may be referred to as Vss. The nMOS circuitry in diagram 800 also includes transistor drains 832, 834.

In the pMOS circuitry, a first pMOS transistor is formed by the source 804, the drain 812, and the gate 848. A second pMOS transistor is formed by the source 806, the drain 814, and the gate 852. A third pMOS transistor is formed by the source 804, the drain 806, and the gate 850; or source 806, the drain 804, and the gate interconnect 850. FIG. 8 also includes a series of gate interconnects 848, 850, 852 that are shared between both the nMOS circuitry and the pMOS circuitry.

In the nMOS circuitry, a first nMOS transistor is formed by the source 824, the drain 832, and the gate 848. A second nMOS transistor is formed by the source 826, the drain 834, and the gate 852. A third nMOS transistor is formed by the source 824, the drain 826, and the gate 850; or the source 826, the drain 824, and the gate 850.

Referring to FIG. 7 and FIG. 8, the source connection 704 is split into two source connections 804, 806. Similarly, the source connection 712 is split into two source connections 824, 826. An additional transistor (pMOS) is located between the two sources 804, 806. An additional transistor (nMOS) is located between the two sources 824, 826. The additional pMOS transistor is formed by source 804, drain 806, and gate 850; or source 806, drain 804, and gate 850. The additional nMOS transistor is formed by source 824, drain 826, and gate 850; or source 816, drain 814, and gate 850. Additionally, gate interconnect 850 is floating.

FIG. 9 is third diagram 900 illustrating an example layout construction. The example layout construction of FIG. 9 illustrates an AND2X2 regular standard cell. The MOS device illustrated in the diagram 900 includes gate interconnects 902, 904. The MOS device illustrated in diagram 900 also includes sources 906, 908. The source 906 is a source for two pMOS transistors. Similarly, the source 908 is a source for two nMOS transistors. FIG. 9 illustrates one example of a series of transistors forming an AND2X2 regular standard cell.

FIG. 10 is a diagram 1000 illustrating a second exemplary layout construction. The example layout construction of FIG. 10 illustrates a source separated AND2X2 standard cell. The AND2X2 is constructed from nMOS and pMOS transistors. Each of the transistors includes a source, a drain, and a gate.

In the illustrated example of FIG. 10, the pMOS transistors are at the top of the page, while the nMOS transistors are at the bottom of the page (with "FIG. 10 indicating the bottom of the page). Referring now to the diagram 1000, various components of the transistors will be discussed. Referring to the pMOS circuitry, diagram 1000 illustrates multiple transistor sources 1004, 1006. As illustrated in the example of FIG. 10, the transistor sources 1004, 1006 are each connected to power rail 1020 which may be a positive voltage. The voltage on the transistor sources 1004, 1006, may be referred to as Vdd. The pMOS circuitry in diagram 1000 also includes transistor drains 1012, 1014.

Referring now to the nMOS circuitry, diagram 1000 illustrates multiple transistor sources 1024, 1026. As illustrated in the example of FIG. 10, the transistor sources 1024, 1026 are each connected to power rail 1030 which may be a negative voltage or a ground voltage. The voltage on the transistor sources 1024, 1026 may be referred to as Vss. The nMOS circuitry in diagram 1000 also includes transistor drains 1032, 1034.

In the pMOS circuitry, a first pMOS transistor is formed by the source 1004, the drain 1012, and the gate 1048. A second pMOS transistor is formed by the source 1006, the drain 1014, and the gate 1082. A third pMOS transistor is formed by the source 1004, the drain 1006, and the gate 1050; or the source 1006, the drain 1004, and the gate 1050. FIG. 10 also includes a series of gate interconnects 1048, 1050, 1052 that are shared between both the nMOS circuitry and the pMOS circuitry.

In the nMOS circuitry, a first nMOS transistor is formed by the source 1024, the drain 1032, and the gate 1048. A second nMOS transistor is formed by the source 1026, the drain 1034, and the gate 1052. A third nMOS transistor is formed by the source 1024, the drain 1026, and the gate 1050; or the source 1026, the drain 1024, and the gate 1050.

Referring to FIG. 9 and FIG. 10, the source connection 906 is split into two source connections 1004, 1006. Similarly, the source connection 908 is split into two source connections 1024, 1026. An additional transistor (pMOS) is located between the two sources 1004, 1006. An additional transistor (nMOS) is located between the two sources 1024, 1026. The additional pMOS transistor is formed by source 1004, drain 1006, and gate 1050; or source 1006, drain 1004, and gate 1050. The additional nMOS transistor is formed by source 1024, drain 1026, and gate 1050; or source 1026, drain 1024, and gate 1050. Gate interconnect 1050 is floating.

In one configuration, a MOS device may include a first MOS transistor (604; 614) having a first MOS transistor source (504; 524; 804; 824; 1004; 1024), a first MOS transistor drain (512; 532; 812; 832; 1012; 1032), and a first MOS transistor gate (548; 848; 1048).

In the configuration, the MOS device may further include a second MOS transistor (606; 616) having a second MOS transistor source (506; 526; 806; 826; 1006; 1026), a second MOS transistor drain (514; 534; 814; 834; 1014; 1034), and a second MOS transistor gate (552; 852; 1052). The second MOS transistor source (506; 526; 806; 826; 1006; 1026), and the first MOS transistor source (504; 524; 804; 824; 1004; 1024) may be coupled to a first voltage source (510; 620; 820; 1020).

In the configuration, the MOS device may further include a third MOS transistor (610; 624) having a third MOS transistor source (504/506; 524/526; 804/806; 824/826; 1004/1006; 1024/1026), a third MOS transistor drain (506/504; 526/524; 806/804; 826/824; 1006/1004; 1026/1024), and a third MOS transistor gate (550; 850; 1050). The third MOS transistor source (504/506; 524/526; 804/806; 824/826; 1004/1006; 1024/1026) may be coupled to the first MOS transistor source (504; 524; 804; 824; 1004; 1024). The third MOS transistor drain (506/504; 526/524; 806/804; 826/824; 1006/1004; 1026/1024) may be coupled to the second MOS transistor source (506; 526; 806; 826; 1006; 1026). The third MOS transistor gate (550; 850; 1050) may be floating. The third MOS transistor gate (550; 850; 1050) may be located between the first MOS transistor source (504; 524; 804; 824; 1004; 1024) and the second MOS transistor source (506; 526; 806; 826; 1006; 1026).

In some examples, the first MOS transistor gate (548; 848; 1048) is connected to the second MOS transistor gate (552; 852; 1052). Additionally, the first MOS transistor drain (512; 532; 812; 832; 1012; 1032) may be connected to the second MOS transistor drain (514; 534; 814; 834; 1014; 1034). The first MOS transistor (604; 614), the second MOS transistor (606; 616), and the third MOS transistor (610; 624) may be fin field effect transistors (finFETs). In some examples, the first MOS transistor (604; 614), the second MOS transistor (606; 616), and the third MOS transistor (610; 624) are one of a pMOS transistors (604; 606; 610) or an nMOS transistors (614; 616; 624).

Some examples of the MOS device may include a fourth MOS transistor (604; 614) having a fourth MOS transistor source (504; 524; 804; 824; 1004; 1024) a fourth MOS transistor drain (512; 532; 812; 832; 1012; 1032) and a fourth MOS transistor gate (548; 848; 1048).

In some examples, the MOS device may further include a fifth MOS transistor (606; 616) having a fifth MOS transistor source (506; 526; 806; 826; 1006; 1026), a fifth MOS transistor drain (514; 534; 814; 834; 1014; 1034), and a fifth MOS transistor gate (552; 852; 1052). The fifth MOS transistor source (506; 806; 1006) and the fourth MOS transistor source (504; 804; 1004) may be coupled to a fourth voltage source (510; 620; 810; 1020).

In some examples, the MOS device may further include a sixth MOS transistor (610; 624) having a sixth MOS transistor source (504; 524; 804; 824; 1004; 1024), a sixth MOS transistor drain (506; 526; 806; 826; 1006; 1026), and a sixth MOS transistor gate (550; 850; 1050). The sixth MOS transistor source (504; 524; 804; 824; 1004; 1024) may be coupled to the fourth MOS transistor source (504; 524; 804; 824; 1004; 1024). The sixth MOS transistor drain (506; 526; 806; 826; 1006; 1026) may be coupled to the fifth MOS transistor source (506; 526; 806; 826; 1006; 1026). The sixth MOS transistor gate (550; 850; 1050) may be floating. The sixth MOS transistor gate (550; 850; 1050) may be located between the fourth MOS transistor source (504; 524; 804; 824; 1004; 1024) and the fifth MOS transistor source (506; 526; 806; 826; 1006; 1026).

In some examples, the fourth MOS transistor gate (548; 848; 1048) is connected to the fifth MOS transistor gate (552; 852; 1052). Additionally, the fourth MOS transistor drain (512; 532; 812; 832; 1012; 1032) may be connected to the fifth MOS transistor drain (514; 534; 814; 834; 1014; 1034). The fourth MOS transistor (604; 614), the fifth MOS transistor (606; 616), and the sixth MOS transistor (610; 624) may be finFETs.

In some examples, the first MOS transistor gate (548; 848; 1048) the second MOS transistor gate (552; 852; 1052), the fourth MOS transistor gate (548; 848; 1048), and the fifth MOS transistor gate (552; 852; 1052) are connected together. Additionally, in some examples, the first MOS transistor drain (512; 532; 812; 832; 1012; 1032), the second MOS transistor drain (514; 534), the fourth MOS transistor drain (512; 532; 812; 832; 1012; 1032), and the fifth MOS transistor drain (514; 534; 814; 834; 1014; 1034) are connected together. Additionally, in some examples, the third MOS transistor gate (550; 850; 1050), and the sixth MOS transistor gate (550; 850; 1050) are formed of a same gate interconnect.

In some examples, the first MOS transistor (604; 614), the second MOS transistor (606; 616), and the third MOS transistor (610; 624) are one of a pMOS transistors (604; 606; 610) or an nMOS transistors (614; 616; 624). Additionally, in some examples, the first voltage source, e.g., Vdd may have a greater voltage than the second voltage source, e.g., Vss.

Figure 11:
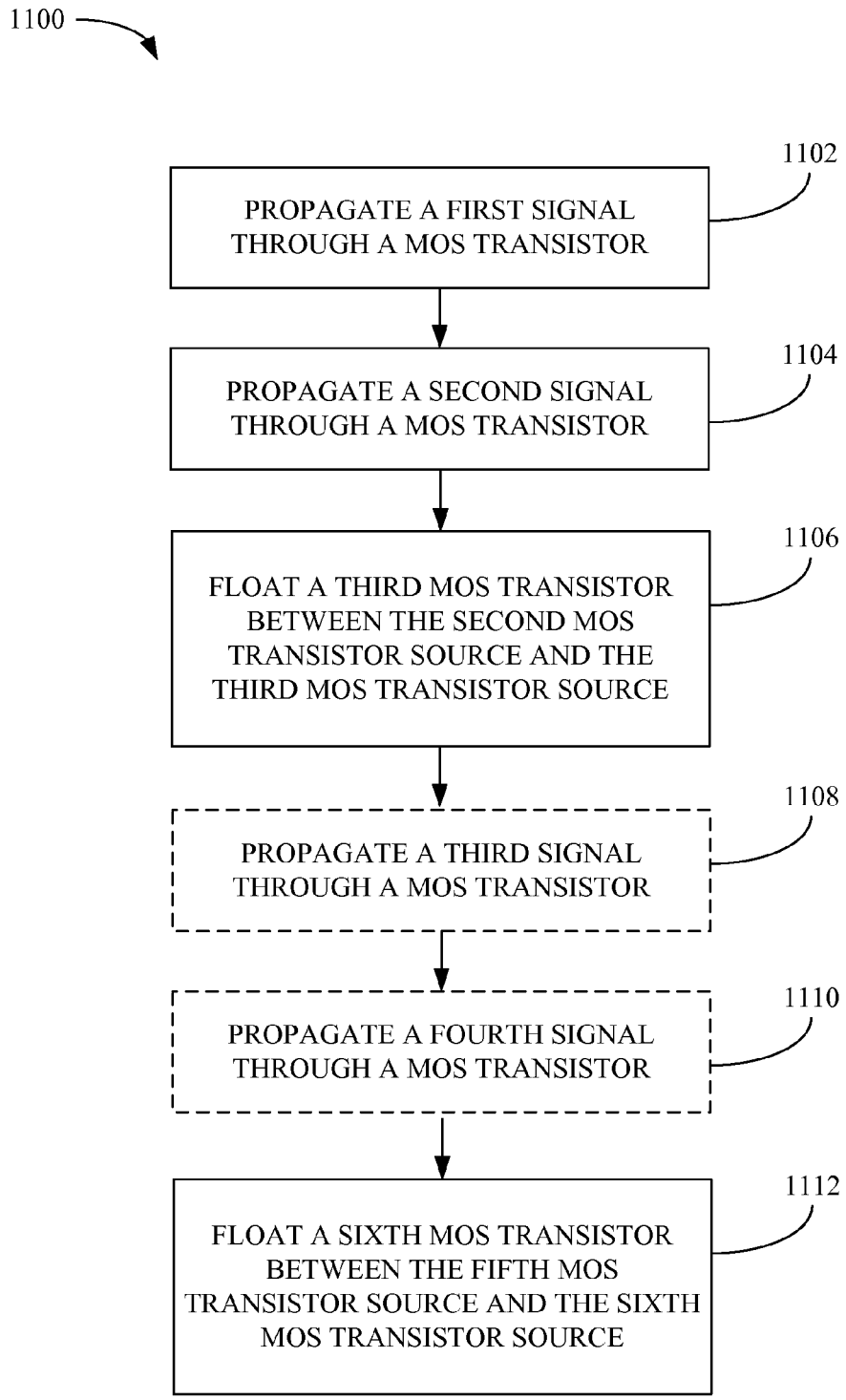
FIG. 11 is a flowchart of an exemplary method of a MOS device.

FIG. 11 is a flowchart 1100 of an exemplary method of a MOS device. In a block 1102, propagate a first signal through a first MOS transistor. The MOS transistor may have a first MOS transistor source (504; 524; 804; 824; 1004; 1024), a first MOS transistor drain (512; 532; 812; 832; 1012; 1032), and a first MOS transistor gate (548; 848; 1048).

In a block 1104, propagate a second signal through a second MOS transistor. The second MOS transistor may have a second MOS transistor source (506; 526; 806; 826; 1006; 1026) a second MOS transistor drain (514; 534; 814; 834; 1014; 1034) and a second MOS transistor gate (552; 852; 1052). The second MOS transistor source (506; 526; 806; 826; 1006; 1026) and the first MOS transistor source (504; 524; 804; 824; 1004; 1024) may be coupled to a first voltage source (510; 620; 820; 1020).

In a block 1106, a third MOS transistor (610; 624) is floated. The third MOS transistor (610; 624) has a third MOS transistor source (504/506; 524/526; 804/806; 824/826; 1004/1026; 1024/1026) a third MOS transistor drain (506/504; 526/524; 806/804; 826/826; 1006/1004; 1026/1024) and a third MOS transistor gate (550; 850; 1050). The third MOS transistor source (504/506; 524/526; 804/806; 824/826; 1004/1026; 1024/1026) may be coupled to the first MOS transistor source (504; 524, 804, 824, 1004, 1024. The third MOS transistor drain (**506/504; 526/524; 806/804;

826/826; 1006/1004; 1026/1024) may be coupled to the second MOS transistor source (506; 526; 806; 826; 1006; 1026). The third MOS transistor gate (550; 850; 1050) may be floating. The third MOS transistor gate (550; 850; 1050) may be located between the first MOS transistor source (504; 524; 804; 824; 1004; 1024) and the second MOS transistor source (506; 526; 806; 826; 1006; 1026).

In a block 1108, propagate a third signal through a fourth MOS transistor. The MOS transistor may have a fourth MOS transistor source (504, 524, 804, 824, 1004, 1024), a fourth MOS transistor drain (512; 532; 812; 832; 1012; 1032), and a fourth MOS transistor gate (548; 848; 1048).

In a block 1110, propagate a fourth signal through a fifth MOS transistor. The fifth MOS transistor may have a fifth MOS transistor source (506; 526; 806; 826; 1006; 1026) a fifth MOS transistor drain (514; 534; 814; 834; 1014; 1034) and a fifth MOS transistor gate (552; 852; 1052). The fifth MOS transistor source (506; 526; 806; 826; 1006; 1026), and the fourth MOS transistor source (504; 524; 804; 824; 1004; 1024) may be coupled to a fourth voltage source (510; 620; 820; 1020).

In a block 1106, a sixth MOS transistor (610; 624) is floated. The sixth MOS transistor (610; 624) has a sixth MOS transistor source (504; 524; 804; 824; 1004; 1024) a sixth MOS transistor drain (506; 526; 806; 826; 1006; 1026) and a sixth MOS transistor gate (550; 850; 1050). The sixth MOS transistor source (504; 524; 804; 824; 1004; 1024 may be coupled to the fourth MOS transistor source (504; 524; 804; 824; 1004; 1024). The sixth MOS transistor drain (506; 526; 806; 826; 1006; 1026) may be coupled to the fifth MOS transistor source (506; 526; 806; 826; 1006; 1026). The sixth MOS transistor gate (550; 850; 1050) may be floating. The sixth MOS transistor gate (550; 850; 1050) may be located between the fourth MOS transistor source (504; 524; 804; 824; 1004; 1024) and the fifth MOS transistor source (506; 526; 806; 826; 1006; 1026).

Some examples may include means for propagating a first signal through a first MOS transistor. The MOS transistor may have a first MOS transistor source (504; 524; 804; 824; 1004; 1024), a first MOS transistor drain (512; 532; 812; 832; 1012; 1032), and a first MOS transistor gate (548; 848; 1048). In some examples, the means for propagating the first signal through the first MOS transistor may be the first MOS transistor itself.

Additionally, some examples may include means for propagating a second signal through a second MOS transistor. The second MOS transistor may have a second MOS transistor source (506; 526; 806; 826; 1006; 1026), a second MOS transistor drain (514; 534; 814; 834; 1014; 1034), and a second MOS transistor gate (552; 852; 1052). The second MOS transistor source (506; 526; 806; 826; 1006; 1026), and the first MOS transistor source (504; 524; 804; 824; 1004; 1024) may be coupled to a first voltage source (510; 620 820; 1020). In some examples, the means for propagating the second signal through the second MOS transistor may be the second MOS transistor itself.

The MOS device may further include means for floating a third MOS transistor (610, 624) having a third MOS transistor source (504/506; 524/526; 804/806; 824/826; 1004/1006; 1024/1026) a third MOS transistor drain (506/504; 526/524; 806/804; 826/824; 1006/1004; 1026/1024) and a third MOS transistor gate (550; 850; 1050). The third MOS transistor source (504/506; 524/526; 804/806; 824/826; 1004/1006; 1024/1026) may be coupled to the first MOS transistor source (504; 524; 804; 824; 1004; 1024). The third MOS transistor drain (506/504; 526/524; 806/804; 826/824; 1006/1004; 1026/1024) may be coupled to the second MOS transistor source (506; 526; 806; 826; 1006; 1026). The third MOS transistor gate (550; 850; 1050) may be floating. The third MOS transistor gate (550; 850; 1050) may be located between the first MOS transistor source (504; 524; 804; 824; 1004; 1024) and the second MOS transistor source (506; 526; 806; 826; 1006; 1026).

Additionally, some examples may include means for propagating a third signal through a fourth MOS transistor. The MOS transistor may have a fourth MOS transistor source (504; 524; 804; 824; 1004; 1024), a fourth MOS transistor drain (512; 532; 812; 832; 1012; 1032), and a fourth MOS transistor gate (548; 848; 1048). In some examples, the means for propagating the third signal through the fourth MOS transistor may be the fourth MOS transistor itself.

Additionally, some examples may include means for propagating a fourth signal through a fifth MOS transistor. The fifth MOS transistor may have a fifth MOS transistor source (506; 526; 806; 826; 1006; 1026) a fifth MOS transistor drain (514; 534; 814; 834; 1014; 1034), and a fifth MOS transistor gate (552; 852; 1052). The fifth MOS transistor source (506; 526; 806; 826; 1006; 1026) and the fourth MOS transistor source (504; 524; 804; 824; 1004; 1024) may be coupled to a fourth voltage source (510; 620 820; 1020). In some examples, the means for propagating the fourth signal through the fifth MOS transistor may be the fifth MOS transistor itself.

The MOS device may further include means for floating a sixth MOS transistor (610; 624) having a sixth MOS transistor source (504; 524; 804; 824; 1004; 1024) a sixth MOS transistor drain (506; 526; 806; 826; 1006; 1026) and a sixth MOS transistor gate (550; 850; 1050). The sixth MOS transistor source (504; 524; 804; 824; 1004; 1024) may be coupled to the first MOS transistor source (504; 524; 804; 824; 1004; 1024). The sixth MOS transistor drain (506; 526; 806; 826; 1006; 1026) may be coupled to the second MOS transistor source (506; 526; 806; 826; 1006; 1026). The sixth MOS transistor gate (550; 850; 1050) may be floating. The sixth MOS transistor gate (550; 850; 1050) may be located between the fourth MOS transistor source (504; 524; 804; 824; 1004; 1024) the and fifth MOS transistor source (506; 526; 806; 826; 1006; 1026).

As provided supra, exemplary multiple split power rail standard cell library architectures are provided. In some examples, the multiple split power rail standard cell library architecture may be utilized when shared power rails are unavailable.

In other examples, the multiple split power rail standard cell library architecture may be utilized when shared power rails are available. In some examples, the multiple split power rail standard cell library architecture may be utilized when shared power rails are available in widths that are insufficient to support IR-drop/EM requirements.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. A metal oxide semiconductor (MOS) device, comprising:
   a first MOS transistor having a first MOS transistor source, a first MOS transistor drain, and a first MOS transistor gate;
   a second MOS transistor having a second MOS transistor source, a second MOS transistor drain, and a second MOS transistor gate, the second MOS transistor source and the first MOS transistor source being coupled to a first voltage source; and
   a third MOS transistor having a third MOS transistor gate, the third MOS transistor gate between the first MOS transistor source and the second MOS transistor source, the third MOS transistor further having a third MOS transistor source and a third MOS transistor drain, the third MOS transistor source sharing a same structure with the first MOS transistor source, the third MOS transistor drain sharing a same structure with the second MOS transistor source, the third MOS transistor gate floating.

2. The MOS device of claim 1, wherein the first MOS transistor gate is connected to the second MOS transistor gate and the first MOS transistor drain is connected to the second MOS transistor drain.

3. The MOS device of claim 1, wherein the MOS transistors are manufactured using a less than 14 nm manufacturing process technology.

4. The MOS device of claim 1, wherein the first MOS transistor, the second MOS transistor, and the third MOS transistor are fin field effect transistors (finFETs).

5. The MOS device of claim 1, wherein the first MOS transistor, the second MOS transistor, and the third MOS transistor are either p-type MOS (pMOS) transistors or n-type MOS (nMOS) transistors.

6. The MOS device of claim 1, further comprising:
   a fourth MOS transistor having a fourth MOS transistor source, a fourth MOS transistor drain, and a fourth MOS transistor gate;
   a fifth MOS transistor having a fifth MOS transistor source, a fifth MOS transistor drain, and a fifth MOS transistor gate, the fifth MOS transistor source and the fourth MOS transistor source being coupled to a second voltage source; and
   a sixth MOS transistor having a sixth MOS transistor source, a sixth MOS transistor drain, and a sixth MOS transistor gate, the sixth MOS transistor source sharing a same structure with the fourth MOS transistor source, the sixth MOS transistor drain sharing a same structure with the fifth MOS transistor source, the sixth MOS transistor gate floating, the sixth MOS transistor gate located between the fourth MOS transistor source and the fifth MOS transistor source.

7. The MOS device of claim 6, wherein the fourth MOS transistor gate is connected to the fifth MOS transistor gate.

8. The MOS device of claim 6, wherein the first MOS transistor gate, the second MOS transistor gate, the fourth MOS transistor gate, and the fifth MOS transistor gate are connected together.

9. The MOS device of claim 6, wherein the fourth MOS transistor drain is connected to the fifth MOS transistor drain.

10. The MOS device of claim 6, wherein the first MOS transistor drain, the second MOS transistor drain, the fourth MOS transistor drain, and the fifth MOS transistor drain are connected together.

11. The MOS device of claim 6, wherein the third MOS transistor gate, and the sixth MOS transistor gate are formed of a same gate interconnect.

12. The MOS device of claim 6, wherein the first MOS transistor, the second MOS transistor, and the third MOS transistor are p-type MOS (pMOS) transistors, and the fourth MOS transistor, the fifth MOS transistor, and the sixth MOS transistor are n-type MOS (nMOS) transistors, and wherein the first voltage source is greater than the second voltage source.

13. A method of a metal oxide semiconductor (MOS) device, comprising:
   propagating a first signal through a first MOS transistor having a first MOS transistor source, a first MOS transistor drain, and a first MOS transistor gate; and
   propagating a second signal through a second MOS transistor having a second MOS transistor source, a second MOS transistor drain, and a second MOS transistor gate, the second MOS transistor source and the first MOS transistor source being coupled to a first voltage source,
   floating a third MOS transistor having a third MOS transistor gate, the third MOS transistor gate between the first MOS transistor source and the second MOS transistor source, the third MOS transistor further having a third MOS transistor source and a third MOS transistor drain, the third MOS transistor source sharing a same structure with the first MOS transistor source, the third MOS transistor drain sharing a same structure with the second MOS transistor source.

14. The method of claim 13, wherein the first MOS transistor gate is connected to the second MOS transistor gate and the first MOS transistor drain is connected to the second MOS transistor drain.

15. The method of claim 13, wherein the MOS transistors are manufactured using a less than 14 nm manufacturing process technology.

16. The method of claim 13, wherein the first MOS transistor, the second MOS transistor, and the third MOS transistor are fin field effect transistors (finFETs).

17. The method of claim 13, wherein the first MOS transistor, the second MOS transistor, and the third MOS transistor are either p-type MOS (pMOS) transistors or n-type MOS (nMOS) transistors.

18. The method of claim 13, further comprising:
propagating a third signal through a fourth MOS transistor having a fourth MOS transistor source, a fourth MOS transistor drain, and a fourth MOS transistor gate; and
propagating a fourth signal through a fifth MOS transistor having a fifth MOS transistor source, a fifth MOS transistor drain, and a fifth MOS transistor gate, the fifth MOS transistor source and the fourth MOS transistor source being coupled to a second voltage source,
floating a sixth MOS transistor having a sixth MOS transistor gate, the sixth MOS transistor gate located between the fourth MOS transistor source and the sixth MOS transistor source, the sixth MOS transistor further having a sixth MOS transistor source, a sixth MOS transistor drain, and a sixth MOS transistor gate, the sixth MOS transistor source sharing a same structure with the fourth MOS transistor source, the sixth MOS transistor drain sharing a same structure with the fifth MOS transistor source.

19. The method of claim 18, wherein the fourth MOS transistor gate is connected to the fifth MOS transistor gate.

20. The method of claim 18, wherein the first MOS transistor gate, the second MOS transistor gate, the fourth MOS transistor gate, and the fifth MOS transistor gate are connected together.

21. The method of claim 18, wherein the fourth MOS transistor drain is connected to the fifth MOS transistor drain.

22. The method of claim 18, wherein the first MOS transistor drain, the second MOS transistor drain, the fourth MOS transistor drain, and the fifth MOS transistor drain are connected together.

23. The method of claim 18, wherein the third MOS transistor gate, and the sixth MOS transistor gate are formed of a same gate interconnect.

24. The method of claim 18, wherein the first MOS transistor, the second MOS transistor, and the third MOS transistor are p-type MOS (pMOS) transistors, and the fourth MOS transistor, the fifth MOS transistor, and the sixth MOS transistor are n-type MOS (nMOS) transistors, and wherein the first voltage source is greater than the second voltage source.

25. A metal oxide semiconductor (MOS) device, comprising:
means for propagating a first signal through a first MOS transistor having a first MOS transistor source, a first MOS transistor drain, and a first MOS transistor gate; and
means for propagating a second signal through a second MOS transistor having a second MOS transistor source, a second MOS transistor drain, and a second MOS transistor gate, the second MOS transistor source and the first MOS transistor source being coupled to a first voltage source,
means for floating a third MOS transistor having a third MOS transistor gate, the third MOS transistor gate located between the first MOS transistor source and the second MOS transistor source, the third MOS transistor further having a third MOS transistor source, a third MOS transistor drain, and a third MOS transistor gate, the third MOS transistor source sharing a same structure with the first MOS transistor source, the third MOS transistor drain sharing a same structure with the second MOS transistor source, the third MOS transistor gate floating.

26. The MOS device of claim 25, wherein the first MOS transistor gate is connected to the second MOS transistor gate and the first MOS transistor drain is connected to the second MOS transistor drain.

27. The MOS device of claim 25, wherein the MOS transistors are manufactured using a less than 14 nm manufacturing process technology.

28. The MOS device of claim 25, wherein the first MOS transistor, the second MOS transistor, and the third MOS transistor are fin field effect transistors (finFETs).

29. The MOS device of claim 25, wherein the first MOS transistor, the second MOS transistor, and the third MOS transistor are either p-type MOS (pMOS) transistors or n-type MOS (nMOS) transistors.

30. The MOS device of claim 25, further comprising:
means for propagating a third signal through a fourth MOS transistor having a fourth MOS transistor source, a fourth MOS transistor drain, and a fourth MOS transistor gate; and
means for propagating a fourth signal through a fifth MOS transistor having a fifth MOS transistor source, a fifth MOS transistor drain, and a fifth MOS transistor gate, the fifth MOS transistor source and the fourth MOS transistor source being coupled to a second voltage source,
means for floating a sixth MOS transistor having a sixth MOS transistor gate, the sixth MOS transistor gate between the fourth MOS transistor source and the sixth MOS transistor source, the sixth MOS transistor further having a sixth MOS transistor source and a sixth MOS transistor drain, the sixth MOS transistor source sharing a same structure with the fourth MOS transistor source, the sixth MOS transistor drain sharing a same structure with the fifth MOS transistor source, the sixth MOS transistor gate floating.

* * * * *